United States Patent [19]

Wang et al.

[11] Patent Number: 5,129,982

[45] Date of Patent: Jul. 14, 1992

[54] SELECTIVE ELECTROCHEMICAL ETCHING

[75] Inventors: Su-Chee S. Wang, Sterling Heights, Mich.; Vincent M. McNeil, Somerville; Martin A. Schmidt, Reading, both of Mass.

[73] Assignees: General Motors Corporation, Detroit, Mich.; Massachusetts Institute of Technology, Cambridge, Mass.

[21] Appl. No.: 670,119

[22] Filed: Mar. 15, 1991

[51] Int. Cl.$^5$ .................... H01L 21/306; B44C 1/22; C03C 15/00; C03C 25/06

[52] U.S. Cl. .................... 156/628; 156/647; 156/653; 156/657; 156/659.1; 156/662; 252/79.5; 204/129.65

[58] Field of Search ............... 156/628, 647, 653, 657, 156/659.1, 662; 252/79.5; 204/129.1, 129.43, 129.65

[56] References Cited

PUBLICATIONS

J. A. Oakes, "A Pressure Sensor for Automotive Application", *Proceedings of Third International Conference on Automotive Electronics*, pp. 143–149, 20–23 Oct. 1981, London, England (published by Mechanical Engineering Publications of London, England).

K. D. Wise and S. K. Clark, "Diaphragm Formation and Pressure Sensitivity in Batch-Fabricated Silicon Pressure Sensors", *IEDM Technical Digest*, International Electron Devices Meeting, Washington, D.C., Dec. 4–6, 1978, pp. 96–98.

R. L. Smith, B. Kloeck, N. DeRooij and S. D. Collins, "The Potential Dependence of Silicon Anisotropic Etching in KOH at 60° C.", *J. Electroanal. Chem.*, vol. 238, pp. 103–113 (1987).

I. Barycka, H. Teterycz, and Z. Znamirowski, "Sodium Hydroxide Solution Shows Selective Etching of Boron-Doped Silicon", *J. Electrochem. Soc.*, vol. 126, pp. 345–346, Feb. 1979.

N. F. Raley, Y. Sugiyama, and T. VanDuzer, "(100) Silicon Etch-Rate Dependence on Boron Concentration in Ethylenediamine-Pyrocatechol-Water Solutions", *J. Electrochem. Soc.*, vol. 131, pp. 161–171, Jan. 1984.

E. D. Palik, V. M. Bermudez, and O. J. Glembocki, "Ellipsometric Study of the Etch-Stop Mechanism in Heavily Doped Silicon", *J. Electrochem. Soc.*, vol. 132, pp. 135–141, Jan. 1985.

H. Seidel, "The Mechanism of Anisotropic, Electrochemical Silicon Etching in Alkaline Solutions", IEEE Solid-State Sensor and Actuator Workshop, Hilton Head Island, pp. 86–91, 1990.

H. A. Waggener, "Electrochemically Controlled Thinning of Silicon", *The Bell System Technical Journal*, pp. 473–475, Mar. 1970.

H. A. Waggener and J. V. Dalton, "Control of Silicon Etch Rates in Hot Alkaline Solutions by Externally Applied Potentials", *Electrochem. Soc. Ext. Abstr. No. 237*, pp. 587–589, Fall Meeting, 1972.

(List continued on next page.)

*Primary Examiner*—William A. Powell
*Attorney, Agent, or Firm*—Robert J. Wallace

[57] ABSTRACT

A method of selectively etching a body of a semiconductor material, such as single crystalline silicon, having regions of n-type and p-type conductivity to remove at least a portion of the n-type region. The body is placed in an etching solution of an etchant having a high pH value and a positive voltage is applied between the body and the etchant. This forms passivating layers on the surfaces of the two regions with the passivating layer on the n-type region being different from that on the p-type region. The voltage is then removed and the body is etched for a period long enough to remove all of the passivating layer from the n-type region and at least a portion of the n-type region, but is not long enough to remove all of the passivating layer from the p-type region. This is allowed by the difference between the passivating layers on the two regions. The steps of forming the passivating layers and etching them is repeated until a desired amount of the n-type region is removed.

25 Claims, 4 Drawing Sheets

PUBLICATIONS

T. N. Jackson, M. A. Tischler, and K. D. Wise, "An Electrochemical P-N Junction Etch-Stop for the Formation of Silicon Microstructures", *IEE Electron Device Letters*, vol. EDL-2, No. 2, pp. 44-45, Feb. 1981.

S. C. Kim and K. D. Wise, "Temperature Sensitivity in Silicon Piezoresistive Pressure Transducers", *IEEE Transactions on Electron Devices*, vol. ED-30, No. 7, pp. 802-810, Jul. 1983.

P. M. Sarro and A. W. vanHerwaarden, "Silicon Cantilever Beams Fabricated by Electrochemically Controlled Etching for Sensor Applications", *J. Electrochem. Soc.*, vol. 133, pp. 1724-1729, Aug. 1986.

M. Hirata, S. Suwazono, and H. Tanigawa, "Diaphragm Thickness Control in Silicon Pressure Sensors Using an Anodic Oxidation Etch-Stop", *J. Electrochem. Soc.*, vol. 134, No. 8, pp. 2037-2041, Aug. 1987.

B. Kloeck, S. D. Collins, N. F. DeRooij, and R. L. Smith, "Study of Electrochemical Etch-Stop for High-Precision Thickness Control of Silicon Membranes", *IEEE Transactions on Electron Devices*, vol. 36, No. 4, pp. 663-669, Apr. 1989.

Y. Linden, L. Tenerz, J. Tiren and B. Hok, "Fabrication of Three-Dimensional Silicon Structures by Means of Doping-Selective Etching (DSE)", *Sensors and Actuators*, 16, pp. 67-82, 1989.

Y. P. Xu and R. S. Huang, "Anodic Dissolution and Passivation of Silicon in Hydrazine", *J. Electrochem. Soc.*, vol. 137, No. 3, pp. 948-953, Mar. 1990.

V. M. McNeil, S. S. Wang, K-Y Ng, and M. A. Schmidt, "An Investigation of the Electrochemical Etching of (100) Silicon in CsOH and KOH", IEEE Solid-State Sensor and Actuator Workshop, Hilton Head Island, pp. 92-97, 1990.

E. D. Palik, J. W. Faust, Jr., H. F. Gray, and R. F. Greene, "Study of the Etch-Stop Mechanism in Silicon", *J. Electrochem. Soc.*, vol. 129, No. 9, pp. 2051-2059, 1982.

J. W. Faust, Jr. and E. D. Palik, "Study of the Orientation Dependent Etching and Initial Anodization of Si in Aqueous KOH", *J. Electrochem. Soc.*, vol. 130, pp. 1413-1420, Jun. 1983.

O. J. Glembocki, R. E. Stahlbush, and M. Tomkiewicz, "Bias-Dependent Etching of Silicon in Aqueous KOH", *J. Electrochem. Soc.*, vol. 132, No. 1, pp. 145-151, Jan. 1985.

R. L. Smith, B. Kloeck, N. F. DeRooij, and S. D. Collins, "The Potential Dependence of Silicon Anisotropic Etching in KOH at 60° C.", *J. Electroanalytical Chem. and Interfacial Electrochem.*, 238, pp. 103-113, 1987.

L. D. Clark, Jr., J. L. Lund, and D. J. Edell, "Cesium Hydroxide (CsOH): A Usual Etchant for Micromachining Silicon", IEEE Solid-State Sensor and Actuator Workshop, Hilton Head Island, Jun. 1988.

L. D. Clark, Jr. and D. J. Edell, "KOH:H$_2$O Etching of (110) Si, (111) Si, SiO$_2$, and Ta: An Experimental Study", IEEE Microrobots and Teleoperators Workshop, Hyannis, Mass., Nov. 1987.

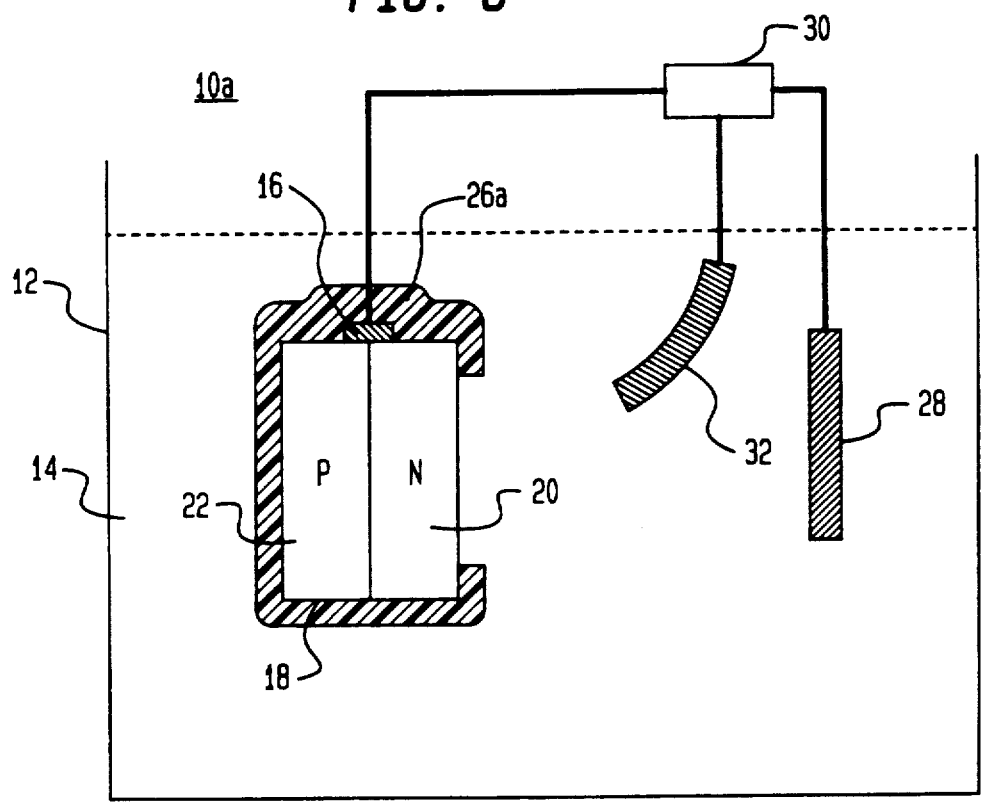

SELECTIVE ELECTROCHEMICAL ETCHING

FIELD OF THE INVENTION

The present invention relates to a method of selectively electrochemically etching semiconductor materials of opposite conductivity type and, more particularly, to a method of selectively electrochemically etching n-type conductivity semiconductor material.

BACKGROUND OF THE INVENTION

Heretofore, an anisotropic etching technique has been used to form bodies of silicon using the property that certain crystallographic planes of a semiconductor material will etch differently than other planes. For example, for single crystalline silicon, etching takes place slower along the <111> planes than along the <100> and <110> planes in etchants with sufficiently high pH values. Typical etchants include KOH, NaOH, LiOH, CsOH, NH$_4$OH, ethylenediamine pyrocatechol, and hydrazine. In addition to the crystal orientation selectivity of these etchants, a sufficiently high constant positive bias applied between a silicon body and electrode both immersed in the etchant will also passivate the surface of the body and stop the etching. This phenomena is referred to as "electrochemical etch stop." The bias required to passivate the surface of the silicon body is denoted as the "passivating potential (voltage)."

The electrochemical etch stop has been utilized in forming the bodies of silicon by starting with a body having a region of n-type conductivity adjacent a region of p-type conductivity with a p-n junction therebetween. The n-type region is formed of the thickness desired for the thin body. The starting body is placed in the chemical etchant with the surface of the p-type region being exposed for etching, and a constant positive bias at or more positive than the passivating potential is applied between the starting body and an electrode in the chemical etchant and spaced from the starting body. This positive voltage reverse-biases the p-n junction so that no current flows into the p-type region. The p-type region is anisotropically etched away by the chemical etchant until it is completely removed. When the p-type region is completely removed so as to expose the n-type region, the positive voltage between the n-type region and the electrode causes a passivation layer of silicon oxide to be formed over the surface of the n-type region which stops the chemical etching. This leaves a thin silicon body of the desired thickness.

A problem with this type of electrochemical etching is that a constant positive bias can cause indiscriminate etch stopping on both p-type and n-type silicon if current flows through the silicon body and into the etchant. Therefore, it is necessary to have a reverse biased junction in order to prevent the flow of current through the p-type region and selectively remove the p-type region while stopping only when the n-type region is reached. However, if there are large reverse leakage currents passing through the junction, the p-type region will be prematurely passivated causing the etching to stop before all of the p-type region is removed. Therefore, it would be desirable to have an electrochemical etching technique which does not rely on the reverse biased junction to control the etching. Also, this technique removes the p-type material leaving the n-type material, so that it cannot be used in cases where a thin layer of p-type material is desired.

SUMMARY OF THE INVENTION

The present invention comprises a method of selectively etching a body of a semiconductor material, such as single crystalline silicon, having regions of opposite conductivity type, such as p-type and n-type, removing the n-type region so as to leave the p-type region. The method comprises first subjecting the body to a positive voltage bias while immersed in an etchant having a high pH value to form a passivating layer on each portion of the body and then removing the bias to allow etching to take place long enough to remove the passivating layer from the n-type region and a portion of the n-type region while not removing all of the passivating layer from the p-type region. These steps are repeated until a desired amount of the n-type region is removed.

The method of the present invention comprises the steps of forming a passivating layer on the surfaces of regions of opposite conductivity type in a body of a semiconductor material. The passivating layer on one of the regions is different from the passivating layer on the other region. The body is then etched in a chemical etchant for a period which removes the passivating layer on the one region and a portion of the one region while not removing all of the passivating layer from the other region.

The invention will be better understood from the following more detailed description taken with the accompanying drawings.

BRIEF DESCRIPTION OF THE DRAWINGS

FIG. 6 is a schematic view of another apparatus which can be used to carry out the method of the present invention.

It should be understood that the drawings are not necessarily to scale.

DETAILED DESCRIPTION

The method of the present invention comprises immersing a body of a semiconductor material, such as single crystalline silicon, having regions of opposite conductivity type, i.e., a region of n-type conductivity and a region of p-type conductivity, in an etchant having a high pH value. The etchant may be KOH, NaOH, LiOH, CsOH, NH$_4$OH, ethylenediamine pyrocatechol, hydrazine or the like. An electrode is also in the etchant and the substrate and electrode are connected across a voltage source. A positive voltage is applied between the substrate and the electrode through the etchant for a given period of time. This forms an oxide passivating film on both regions of the substrate. We have found that the passivating film formed on the p-type region is different from the passivating film formed on the n-type region. We do not know whether the difference between the passivating films on the p-type region and n-type region is a matter of film thickness or film composition which has different etching properties. However, we do know that the passivating films formed on the two regions over the same period of time will be etched away differently in that the passivating film on the n-type region is etched away faster than the film on the p-type region. Using this discovery, the voltage is turned off which causes the passivating films to be etched by the etchant. The etching is carried out for a period of time which removes all of the passivating film from the n-type region and a portion of the n-type silicon, but does not completely remove all of the passivating film from the p-type region.

The positive voltage is again applied between the semiconductor body and the electrode to reform a passivating film on both the p-type region and the n-type region. The voltage is turned off and the etching step is repeated. The two steps of forming the passivating film on the regions of the semiconductor body and etching completely away the passivating film from the n-type region and a portion of the n-type region are repeated until the n-type region is completely etched away leaving only the p-type region or an n-type region of a desired thickness if achieved.

Figure 1:
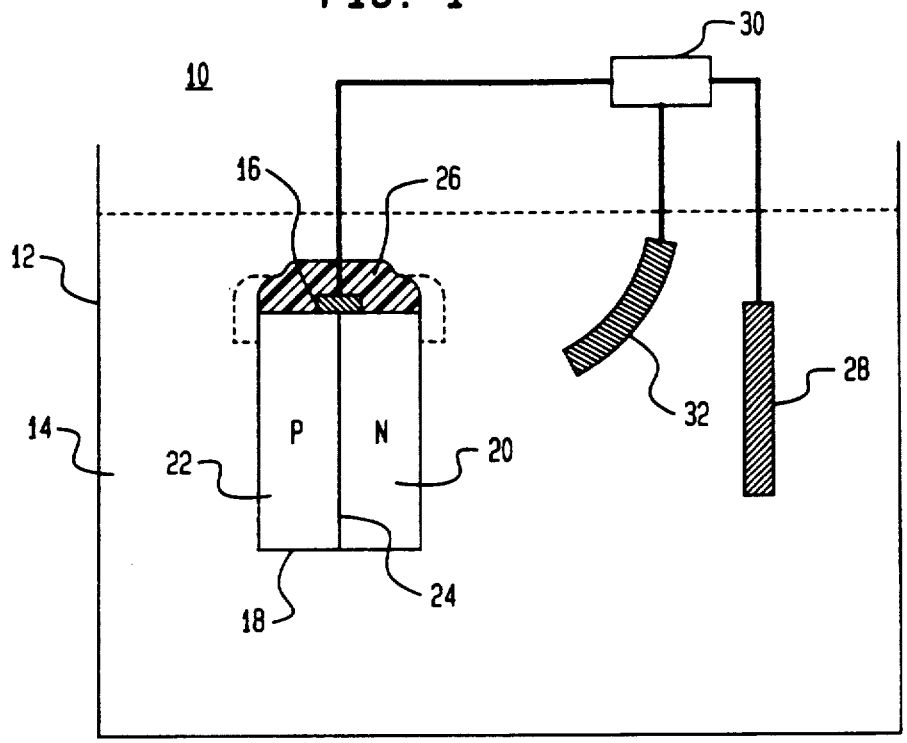
FIG. 1 is a schematic view of an apparatus which can be used to carry out the method of the present invention.

Referring now to FIG. 1, there is shown an electrochemical etching apparatus 10 which is useful for etching silicon and which can be used to carry out the method of the present invention. Apparatus 10 comprises a container 12 which contains a liquid chemical etchant 14. A wafer support electrode 16 is in the container 12 and has a body 18 of a semiconductor material, such as silicon, to be etched thereon. The body 18 has thereacross a region 20 of n-type conductivity and an adjacent region 22 of p-type conductivity which form a p-n junction 24. Electrode 16 extends across the outer edge of the body 18 so as to make physical and electrical contact to the body 18 while leaving the surfaces of both of the regions 20 and 22 exposed to the liquid etchant 14. A masking layer 26 is coated over the electrode 16 to protect it from the etching solution. The p-type region 22 is of a thickness equal to the desired thickness of the body to be formed. If only a portion of the n-type region 20 is to be removed, a masking layer may also be coated over the portion of the n-type region 20 which is not to be etched away. In order to further protect electrode 16 from the etching solution as portions of body 18 are etched away, masking layer 26 can be extended to cover top portions of regions 20 and 22 as is shown by the dashed lines.

A counter electrode 28 is within the chemical etchant 14 and is spaced from the body 18. The counter electrode 28 and the support electrode 16 are electrically connected to a potentiostat 30. A reference electrode 32 is within the chemical etchant 14 between the counter electrode 28 and the body 18. The reference electrode 32 is also electrically connected to the potentiostat 30 so as to permit adjustment of the voltage between the support electrode 16 and the electrode 28.

In using the apparatus 10 to carry out the method of the present invention, the potentiostat 30 is turned on and adjusted to provide a positive voltage greater than zero volts between the semiconductor body 18 and the counter electrode 28 for a desired period of time. The voltage is measured between the semiconductor body 18 through the contact 16 and the reference electrode 32 which measurement is used to adjust the potentiostat 30 to achieve a desired voltage between the semiconductor body 18 and the counter electrode 28. This forms the passivating film on the surface of both the n-type region 20 and the p-type region 22 with the passivating film on the p-type region 22 being different from that on the n-type region 20. The voltage source is then turned off. This allows the etching solution 14 to etch the passivating films. The etching is carried out for a time period which removes all of the passivating film from the n-type region 20 and a portion of the n-type region 20 while not completely removing all of the passivating film from the p-type region 22. These two steps are repeated until either all of the n-type region 20 is removed leaving only the p-type region 22, or a desired amount of the n-type region 20 is removed.

Figure 2:
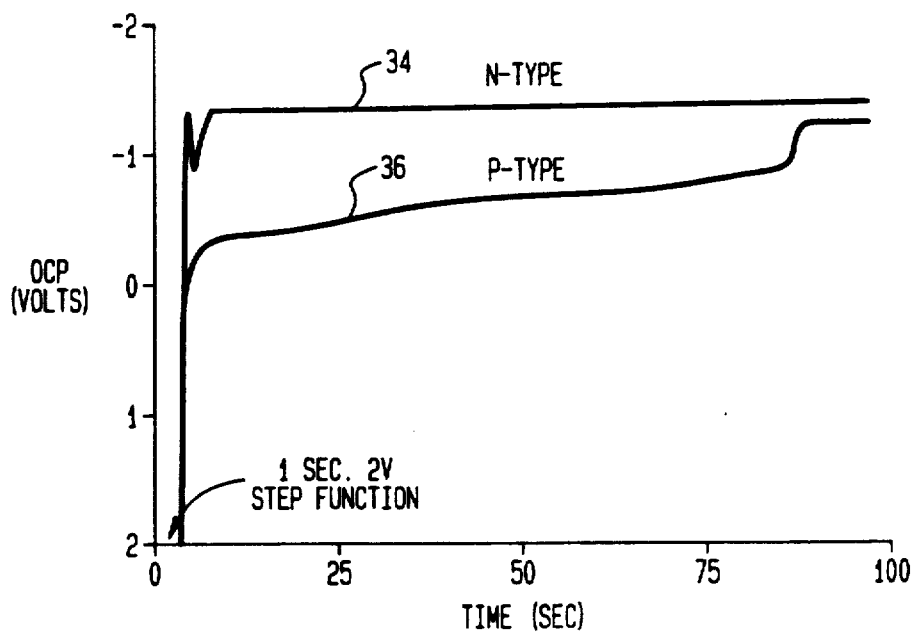
FIG. 2 is a graph showing the open circuit potential vs. time for semiconductor materials of different conductivity types during the etching process of the present invention.

Referring to FIG. 2, there is shown a graph of open circuit potential (OCP) in volts versus time in seconds for regions of n-type conductivity and p-type conductivity treated in accordance with the method of the present invention. The bodies were placed in a 20% solution of KOH at 60° C. and a potential of 2 volts was applied between the regions and the reference electrode for 1 second. This voltage could be from a few tenths of a volt to many volts. The voltage was turned off and the bodies were etched while monitoring the open circuit potential between the regions and the electrodes. The open circuit potential reaches a steady value when all of the passivating film formed on the region is completely etched away. In FIG. 2, line 34 is for the n-type region and line 36 is for the p-type region. It can be seen from line 34 that the n-type region reached its open circuit potential in about 3 seconds while from line 36 it can be seen that the p-type region did not reach its open circuit potential until about 85 seconds. Thus, it took 3 seconds to remove all of the passivating film from the n-type region while it took 85 seconds to remove all of the passivating film from the p-type region This indicates that for the same period of time for the anodic potential step, the passivating film formed on the n-type region is in some manner different from that formed on the p-type region. Thus, if during the method of the present invention, the body 18 is subjected to 2 volts for one second and then the voltage is turned off, the etching step should be for at least 3 seconds but for not longer than 85 seconds This removes the passivating film completely from the n-type region and a portion of the n-type region, but does not remove all of the passivating film from the p-type region.

KOH can be used in concentrations of 5% to 95% and within a temperature range of 10° C. to 120° C. NaOH, LiOH, CsOH, NH$_4$OH, ethylenediamine pyrocatechol and hydrazine at concentration levels of 5% to 95% and with a temperature range of 10° C. to 120° C. can be substituted for KOH.

Figure 3:
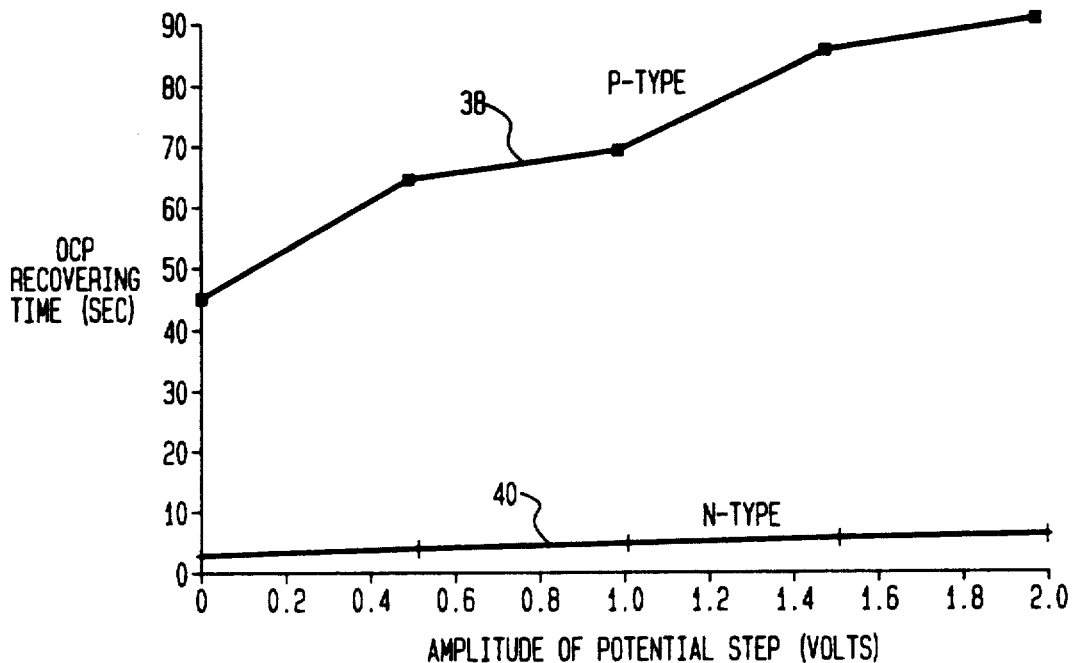
FIG. 3 is a graph showing the open circuit recovery time vs. amplitude of applied potential for semiconductor materials of different conductivity types during the process of the present invention.

Referring now to FIG. 3, there is shown a graph of open circuit potential (OCP) recovery time in seconds versus amplitude of potential in volts applied between the semiconductor body and the electrode. The top line 38 is for the p-type region and the bottom line 40 is for the n-type region. The semiconductor body was in a 20% solution of KOH at 60° C. It can be seen from this graph that the etching time characteristics of the passivating film formed on the n-type region does not change very much as the voltage is increased up to about 2 volts whereas the passivating film on the p-type region does increase with increasing voltage.

Figure 4:
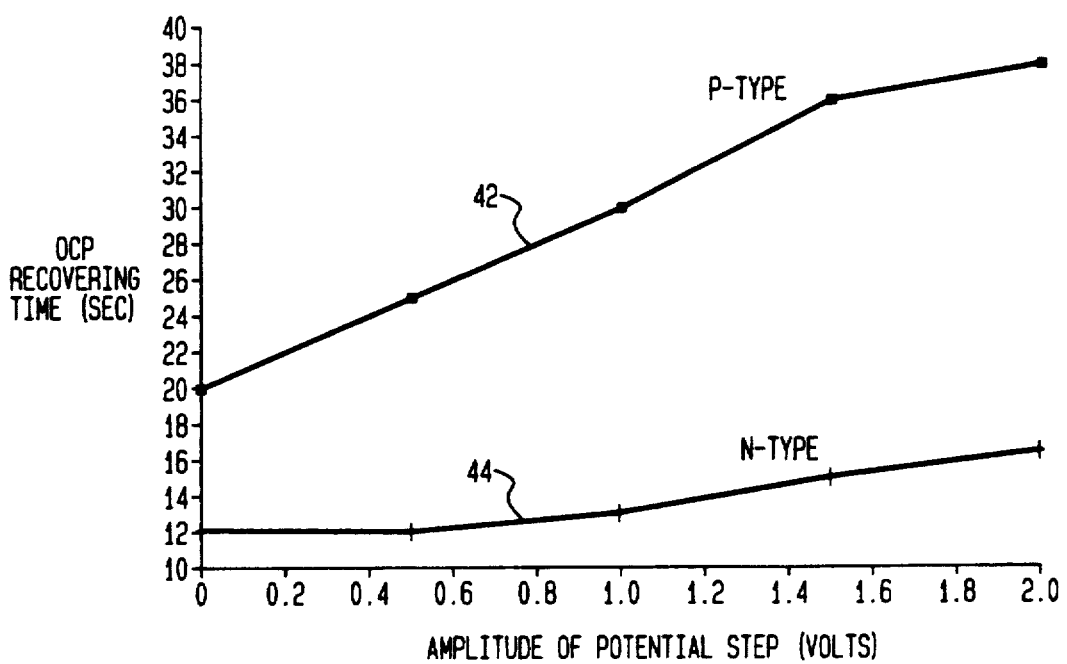
FIG. 4 is a graph similar to FIG. 3 except that the concentration of the etchant is changed.

Referring now to FIG. 4, there is shown a graph similar to that of FIG. 3 except that the etchant is a 40% solution of KOH at 60° C. The top line 42 is for the p-type region and the bottom line 44 is for the n-type region. As can be seen from this graph, changing the etchant solution does provide a greater change in the etching time characteristics of the passivating film formed on the n-type region with increasing potential and does change the etching time characteristics of the passivating film formed on the p-type region from that obtained in a 20% solution of KOH. Thus, using different solutions of the same etchant changes the etching time characteristics of the passivating films obtained on the regions of the semiconductor body. We have found that a 20% solution of KOH is preferred because of the shorter etching time characteristics of the passivating film formed on the n-type region. This allows the desired amount of the n-type region to be removed with fewer steps.

Figure 5:
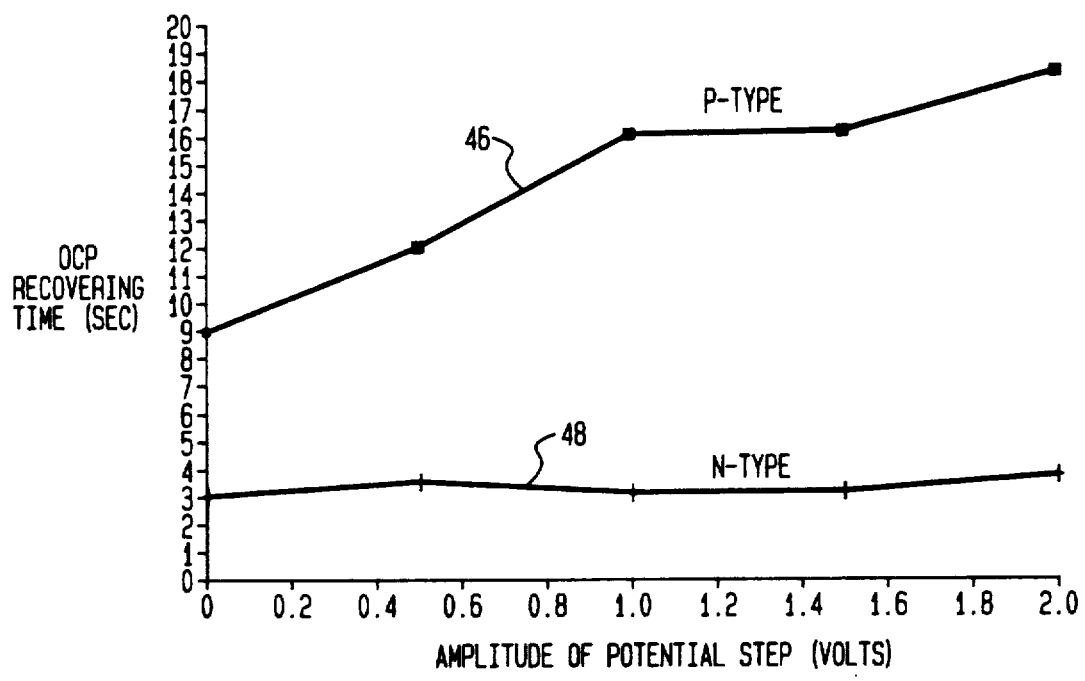
FIG. 5 is a graph similar to FIG. 3 except that the temperature of the etchant is changed.

Referring to FIG. 5, there is shown a graph similar to FIG. 3 except that the etching solution is at 80° C. Again, the top line 46 is for the p-type region and the bottom line 48 is for the n-type region.

The method of the present invention can be used to form thin diaphragms of p-type semiconductor material. For this purpose, a thin layer of the p-type semiconductor material is epitaxially deposited on a surface of a substrate of n-type conductivity. The semiconductor body is then subjected to the method of the present invention to remove the n-type substrate leaving only the thin layer of p-type semiconductor material. If a support is desired for the diaphragm, only the central portion of the substrate is etched away leaving a thick rim of the n-type substrate around the periphery of the diaphragm. Such semiconductor diaphragms can be used as microsensors in pressure transducers, accelerometers and flow sensors.

The method of the present invention can also be used to make wafers for silicon on insulator (SOI) technology. For this purpose, a thin layer of p-type silicon is epitaxially deposited on a substrate of n-type silicon. This is then bonded to a silicon dioxide layer on another silicon substrate with the p-type layer being bonded to the silicon dioxide layer and with a portion of the p-type layer projecting beyond the edge of the silicon oxide so as to be exposed. The device is then subjected to the method of the present invention to remove the n-type substrate from the p-type layer. This leaves the p-type single crystalline silicon layer on a silicon dioxide layer, and hence insulated from the silicon substrate. An integrated circuit or the like can then be formed in the p-type layer. This method of forming an SOI wafer has the advantage that the p-type silicon layer is of good crystalline quality since it was epitaxially grown on a silicon substrate.

Thus, there is provided by the present invention a method of selective electrochemical etching to form a thin layer of p-type conductivity semiconductor material, such as single crystalline silicon. The method utilizes the discovery that the passivation oxide layer electrochemically formed on n-type conductivity silicon is different from that formed on p-type conductivity silicon. This difference allows the passivation layer formed on the n-type layer to be etched away more quickly than the passivation layer formed on the p-type layer so that a portion of the n-type layer can be etched away before all of the passivation layer on the p-type layer is removed. By repeating the passivation layer forming step and the etching step, all or any desired amount of the n-type layer can be removed without removing any of the p-type layer. This process does not require the forward biasing of a p-n junction, and, in fact, does not require a p-n junction at all. Although the method of the present invention has been described with regard to a body having adjacent regions of p-type and n-type conductivity, the two regions can be separated from each other and can be two regions formed along the same surface of a substrate. All that is required is that both regions be simultaneously subjected to the electrochemical passivation layer forming step and to the following etching step.

Referring now to FIG. 6, there is shown an electrochemical etching apparatus 10a which is useful for etching silicon and which can be used to carry out the method of the present invention. Apparatus 10a is very similar to apparatus 10 of FIG. 1 except that a masking layer 26a surrounds three sides of p-type region 22 and portions of n-type region 20 leaving only a portion of region 20 exposed to etchant 14. Apparatus 10a is operated using essentially the same method as apparatus 10a of FIG. 1. The result of this operation is that a portion of region 20 which is exposed to etchant is completely etched away so as to expose a portion of region 22 to the etchant 14. This occurs in essentially the same manner as region 20 of apparatus 10 of FIG. 1 is etched away. When the p-type region 20 is exposed to the etchant, it forms a silicon dioxide layer which protects region 20 from being etched away in the same manner as occurs with region 22 of apparatus 10 of FIG. 1. The result of using the method of the present invention with the apparatus 10a of FIG. 6 is a semiconductor body comprised of a p-n junction with a central portion of the n-type region removed so as to provide a thin p-type diaphragm which is useful as a semiconductor sensor. This type of structure is also obtainable using another method invented by the same inventors which is disclosed and claimed in a co-pending U.S. patent application Ser. No. 07/669,158 now abandoned, entitled, "Method of Selectively Etching Silicon," and filed concurrently with the present patent application and having a common assignee.

It is to be appreciated and understood that the specific embodiments of the invention are merely illustrative of the general principles of the invention. Various modifications may be made consistent with the principles set forth. For example, although KOH has been described as being a preferred etching solution, any of the other etching solutions mentioned above can also be used. Still further, the voltage applied across the body can be varied, and the etching time can be varied as long as it is longer than required to completely remove the passivation layer from the n-type region without completely removing the passivation layer from the p-type region. Still further, other forms of bodies containing p-type and n-type regions may be used as long as both regions can be exposed to the etching solution and have a common voltage placed thereacross. Still further, the method of the present invention can be used to make other devices which require a thin layer of p-type conductivity. Furthermore, it is possible that under certain etchant and bias conditions, the p-type passivating layer etches away faster than the n-type passivating layer. In this case it is possible, using the present invention, to form a thin layer of n-type conductivity.

The embodiments of the invention in which an exclusive property or privilege is claimed are defined as follows:

1. A method of selectively etching from a body of a semiconductor material having regions of opposite conductivity type at least a portion of the region of one conductivity type comprising the steps of:
   forming on the surfaces of the regions passivating layers with the passivating layer on the region of one conductivity type being different from that of the passivating layer on the region of the other conductivity type; and
   etching the body in a chemical etchant for a period of time long enough to etch away all of the passivating layer on the region of the one conductivity type and a portion of the region of the one conductivity type, but not long enough to remove all of the passivating layer from the region of the other conductivity type.

2. The method of claim 1 wherein the steps of forming the passivating layers on the regions and etching the passivating layer from the region of one conductivity type are repeated until a desired amount of the region of one conductivity type is removed.

3. The method of claim 2 in which the one conductivity type is n-type and the other conductivity type is p-type.

4. The method of claim 3 in which the forming and etching steps are repeated until all of the n-type region is removed.

5. The method of claim 3 in which the body is of single crystalline silicon

6. The method of claim 1 in which the passivating layers are formed by placing the body in an etchant having a high pH value and applying a positive voltage between the body and the etchant.

7. The method of claim 6 in which the etching step is carried out by removing the positive voltage from between the body and the etchant and exposing the passivating layers to the etchant.

8. The method of claim 7 in which the voltage is applied by immersing an electrode in the etchant spaced from the body and connecting the electrode and the body across a voltage source to achieve the desired voltage.

9. The method of claim 8 wherein the steps of forming the passivating layer on the regions and etching the passivating layer from the region of one conductivity type are repeated until a desired amount of the region of one conductivity type is removed.

10. The method of claim 9 in which the forming and etching steps are repeated until all of the region of one conductivity type is removed.

11. The method of claim 9 in which the one conductivity type is n-type and the other conductivity type is p-type.

12. The method of claim 11 in which the body is of single crystalline silicon.

13. The method of claim 12 in which the etchant is selected from the group consisting of KOH, NaOH, LiOH, CsOH, NH$_4$OH, ethylenediamine pyrocatechol, and hydrazine.

14. The method of claim 13 in which the etchant has a concentration of 5% to 95% and a temperature in the range of about 10° C. to 120° C.

15. The method of claim 14 in which the etchant is a 20% solution of KOH at 60° C.

16. A method of selectively etching from a body of a semiconductor material having regions of opposite conductivity type at least a portion of the region of one conductivity type comprising the steps of:
   immersing the body in an etchant of high pH value which will etch the semiconductor material and an oxide of the semiconductor material;
   applying a voltage between the body and the etchant of the polarity suitable to form an oxide passivating layer on the surface of the regions with the passivating layer on the region of one conductivity type being different from the passivating layer on the region of the other conductivity type; and then
   etching away the passivating layers for a long enough period of time to remove all of the passivating layer from the region of one conductivity type and a portion of the region of the one conductivity type but which does not remove all of the passivating layer from the region of the other conductivity type.

17. The method of claim 16 in which the one conductivity type is n-type and the opposite conductivity type is p-type.

18. The method of claim 17 in which a positive voltage is applied between the body and the etchant.

19. The method of claim 18 in which the voltage is applied by immersing an electrode in the etchant spaced from the body and connecting the body and electrode across a source of current to achieve the desired voltage.

20. The method of claim 18 in which the etching is carried out by removing the voltage between the body and the etchant.

21. The method of claim 20 in which the steps of forming the passivating layers and etching away the passivating layers and the region of n-type conductivity is repeated until a desired amount of the region of n-type conductivity is removed.

22. The method of claim 21 in which the body is of single crystalline silicon.

23. The method of claim 22 in which the etchant is selected from the group consisting of KOH, NaOH, LiOH, CsOH, NH$_4$OH, ethylenediamine pyrocatechol, and hydrazine.

24. The method of claim 23 in which the etchant has a concentration of 5% to 95% and a temperature in the range of about 10° C. to 120° C.

25. The method of claim 24 in which the etchant is a 20% solution of KOH at 60° C.

* * * * *